(12) United States Patent
Chan et al.

(10) Patent No.: US 7,113,433 B2
(45) Date of Patent: Sep. 26, 2006

(54) LOCAL BIT SELECT WITH SUPPRESSION OF FAST READ BEFORE WRITE

(75) Inventors: Yuen H. Chan, Poughkeepsie, NY (US); Ryan T. Freese, Poughkeepsie, NY (US); Antonio R. Pelella, Highland Falls, NY (US); Arthur D. Tuminaro, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/054,402

(22) Filed: Feb. 9, 2005

(65) Prior Publication Data

US 2006/0176729 A1 Aug. 10, 2006

(51) Int. Cl.
*G11C 7/00* (2006.01)

(52) U.S. Cl. ............... 365/190; 365/154; 365/156; 365/189.06; 365/189.11

(58) Field of Classification Search ............ None
See application file for complete search history.

(56) References Cited

U.S. PATENT DOCUMENTS

| | | | | |
|---|---|---|---|---|
| 5,831,911 A | * | 11/1998 | Cho | 365/189.11 |
| 5,850,367 A | * | 12/1998 | Wada et al. | 365/230.03 |
| 5,973,973 A | * | 10/1999 | Utsugi | 365/205 |
| 5,986,914 A | * | 11/1999 | McClure | 365/63 |
| 6,088,276 A | * | 7/2000 | Ukita | 365/207 |
| 6,292,408 B1 | * | 9/2001 | Kawashima et al. | 365/189.11 |
| 6,751,141 B1 | * | 6/2004 | Alvandpour et al. | 365/208 |
| 6,839,268 B1 | * | 1/2005 | Osada et al. | 365/156 |
| 6,930,941 B1 | * | 8/2005 | Nakase | 365/205 |

* cited by examiner

*Primary Examiner*—Son L. Mai
(74) *Attorney, Agent, or Firm*—Lynn L. Augspurger; Laurence J. Marhoefer

(57) ABSTRACT

A domino SRAM is provided with active pull-up PFET devices that overwhelm "slow to write but very fast to read" cells and allow the cells to recover from timing mismatch situations. This approach allows the traditional "bit select" clamp to actively control the "local select" through "wired-or" PFET pull-up transistors. Separate read and write global "bit line" pairs allow the read and write performance to be optimized independently.

2 Claims, 5 Drawing Sheets

LOCAL BIT SELECT WITH SUPPRESSION OF FAST READ BEFORE WRITE

CROSS-REFERENCE TO RELATED APPLICTIONS

This application contains subject matter that is related to the subject matter of the following co-pending applications, each of which is assigned to the assignee of this application, International Business Machines Corporation of Armonk, N.Y. Each of the below listed applications is hereby incorporated herein by reference in its entirety. High Speed Domino Bit Line Interface Early Read and Noise Suppression, Ser. No. 11/054,296; Global Bit Select Circuit With Dual Read and Write Bit Line Pairs, Ser. No. 11/054,309; Local Bit Select Circuit With Slow Read Recovery Scheme, Ser. No. 11/054,148; Global Bit Line Restore Timing Scheme and Circuit, Ser. No. 11/054,479.

BACKGROUND OF THE INVENTION

1. Field of the Invention

This invention relates to a high performance domino STATIC RANDOM ACCESS MEMORY (SRAM) in which the core memory cells are organized into sub-arrays accessed by local bit lines connected to global bit lines, and more particularly to an improved domino SRAM.

2. Description of Background

A static semiconductor memory typically includes six-transistor cell in which four transistors are configured as a cross-coupled latch for storing data. The remaining two transistors are used to obtain access to the memory cell. During a read access, differential data stored in the memory cell is transferred to the attached bit line pair. A sense amplifier senses the differential voltage that develops across the bit line pair. During a write access, data is written into the memory cell through the differential bit line pair. Typically, one side of the bit line pair is driven to a logic low level potential and the other side is driven to a high voltage level. The cells are arranged in an array that has a grid formed of bit lines and word lines, with the memory cells disposed at intersections of the bit lines and the word lines. The bit lines and the word lines are selectively asserted or negated to enable at least one cell to be read or written to.

As will be appreciated by those skilled in the art, in prior art domino SRAM design the cells are arranged into groups of cells, typically on the order of eight to sixteen cells per group. Each cell in a group is connected to a local bit line pair. The local bit line pair for each group of cells is coupled to a global bit line pair. Rather than use sense amplifier to detect a differential voltage when reading a cell, in a domino SRAM the local bit lines are precharged and discharged by the cell in a read operation, which discharge is detected and determines the state of the cell. The local bit line, the precharge means, and the detection means define a dynamic node of the domino SRAM. Domino SRAMs of the type discussed here are explained in greater detail in U.S. Pat. Nos. 5,729,501, 6,058,065 and 6,657,886, which are incorporated herein by reference.

In a domino SRAM array, in the read operation the cell must produce a bit line voltage large enough to drive off the SRAM macro with no help from a sense amplifier. In this situation, the "write" operation becomes the primary design focus due to a situation called "Fast Read before Write".

The problem occurs when a cell is slow to write but very fast to read, which can result in both of the local bit lines being pulled down to ground making the cell un-writable. For example, during a write to the opposite state, the "write transistor" in the "local bit selector" pulls down on one "local bit line", while the cell pulls down on the opposite "local bit line", resulting in both "local bit lines" being pulled down to ground, thereby preventing the cell from writing. A cell that is slow to write, but very fast to read, is caused by manufacturing process variations. Due to device parametric variations, the PFET could be skewed to the strong side and the NFET to the weak side, making the NFET pass gate more difficult to overcome the PFET in a write operation. If the device and metal capacitance is on the low side, and the NFET pass gate threshold voltage Vt is low, the cell could have a fast read.

A similar problem can occur when a timing mismatch takes place between the "row" select and the "column" select lines. For example, if the row line becomes active before the write signal arrives at the "local bit select", the cell is in read mode before the write can occur, resulting in a similar situation where both "local bit lines" are pulled down to ground leaving the cell in a "un-writeable" state. (Remember, 6T cells are good at pulling down on their local bit lines, but poor at pulling up because their pass gates are NFETs.) This "Fast Read before Write" is not a problem in traditional SRAM designs using sense amp's because the "bit selector" used there has bit line clamps to prevent this from occurring. Also, the traditional approach has more cells on a bit line (i.e. on the order of 128-to-256 cells vs. 8-to-16 cell in our new approach) making the bit lines much more capacitive and much slower to develop a voltage differential; therefore, making it less likely to have the "Fast Read before Write" situation even without the clamps. One way to minimize the problem in Domino Read SRAMs is to "push-out" the "row" select signal to guarantee the "write data" is available to the local bit line before the cell is selected. However, some cells will still cause a "Fast Read before Write" because they are "slow to write but very fast to read" even though they are within the normal manufacturing window. This solution results in a performance slow-down and does not solve or prevent the un-writeable state.

SUMMARY OF THE INVENTION

An object of this invention is the provision of domino SRAM circuit that allows both the read function and the write function to be optimized. For example, larger write transistors can be used without affecting the read performance.

Another object of the invention is the provision of a domino SRAM circuit that prevents the cell from being in a state in which it cannot be written to because of a just previous read.

Briefly, this invention contemplates the provision of a domino SRAM in which active pull-up PFET devices overwhelm "slow to write but very fast to read" cells and allow the cells to recover from the timing mismatch situations described above. This approach allows the traditional "bit select" clamp to actively control the "local select" through "wired-or" PFET pull-up transistors. Separate read and write global "bit line" pairs allow the read and write performance to be optimized independently. For example, larger write transistors will not effect the read performance as is the case in the traditional "local bit select" approach where a single bit line pair is used for reading and delivering the write data to the SRAM cells. As a result, this solution does not slow down the read/write operation, and in fact it improves the performance over the traditional "local bit select" approach.

This global dual bit line pair approach also prevents a fast reading cell from corrupting the "write data".

BRIEF DESCRIPTION OF THE DRAWINGS

The subject matter, which is regarded as the invention, is particularly pointed out and distinctly claimed in the claims at the conclusion of the specification. The forgoing and other objects, features, and advantages of the invention are apparent from the following detailed description taken in conjunction with the drawings in which:

DETAILED DESCRIPTION OF THE INVENTION

Figure 1:
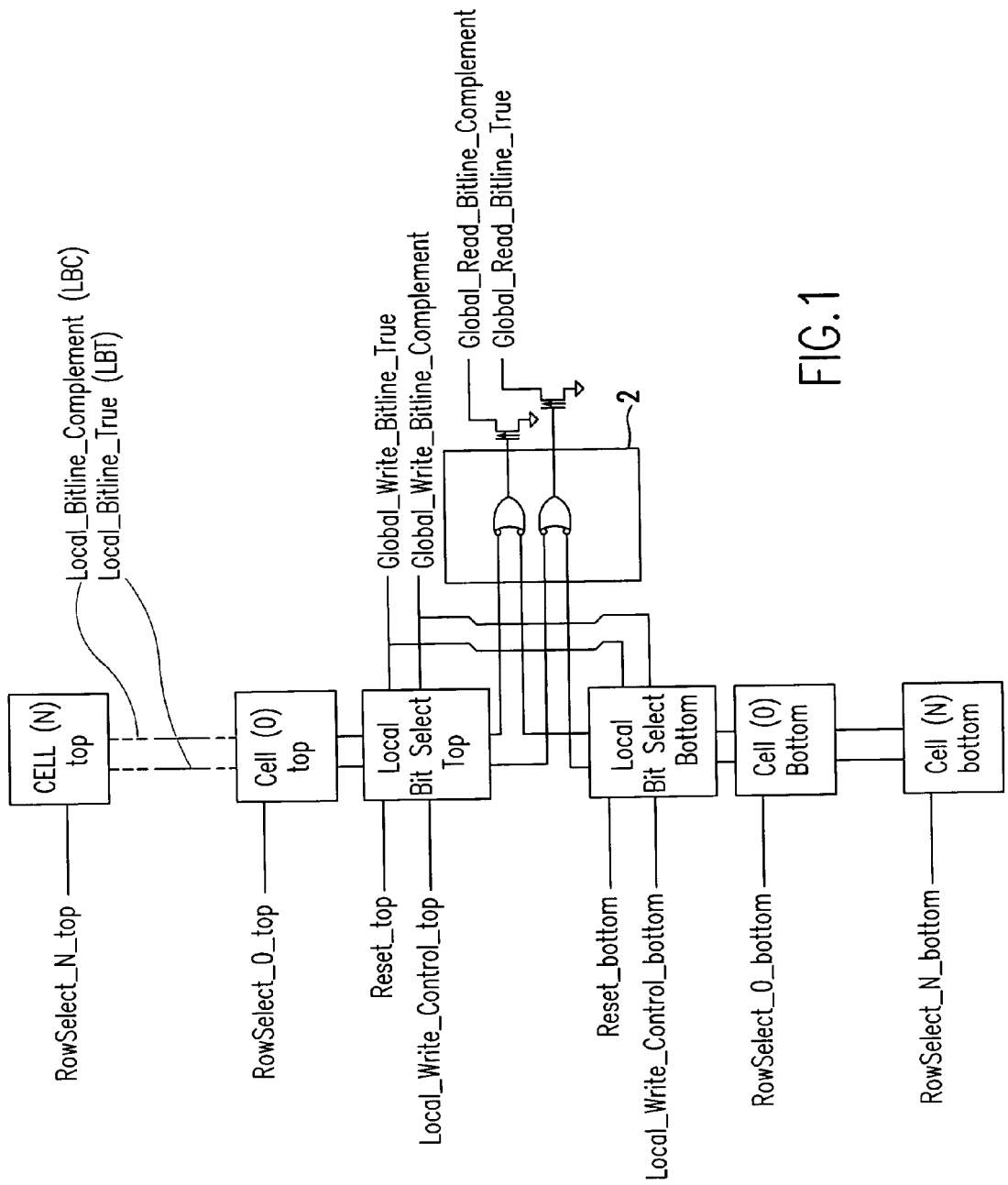
FIG. 1 is a partially block diagram and partially schematic diagram of sub array of N cells served by a local bit select in accordance with the teachings of this invention.

Referring to FIG. 1, it shows a domino SRAM "subarray" accessed by a Local Bit Select logic. This subarray has 0 through N cells labeled "top" and 0 through N cells labeled "bottom" with the top and bottom cells mirrored around a low active input "OR" function 2, with half the cells on one side and half on the other. The local bit lines are "OR'ed" together (i.e. the top local bit line complement (LBC) is "OR'ed" with the bottom LBC, and the top local bit line true (LBT) is "OR'ed" with the bottom LBT) to drive the "Wired OR" NFET, output which are connected to the complement and true global read bit lines. In standby state, the local bit lines are pre-charged to high level. In read mode, the active memory cell (from either the top or bottom subarray) pulls down on one of the local bit line. The active low bit line, through the OR gate, turns on the "wired OR" NFEET to pull down the global read bit line. Arranging the cells around a central point of the "OR" function 2, reduces the RC delay on the "local bit lines" because the distance to the furthest cell has been reduced by half. This improves both the write performance as well as the read access time of the subarray. The local bit select circuit, in addition to providing the read signal transfer, also provides the write control function. It has a set of global write bit lines (complement and true lines) as input. The write operation is controlled by the local write control line. Each local bit select circuit also performs the bit line pre-charge function (also known as bit line restore) at the end of an active read or write cycle. The local bit line's restore operation is triggered by the "Reset" signal.

Figure 2:
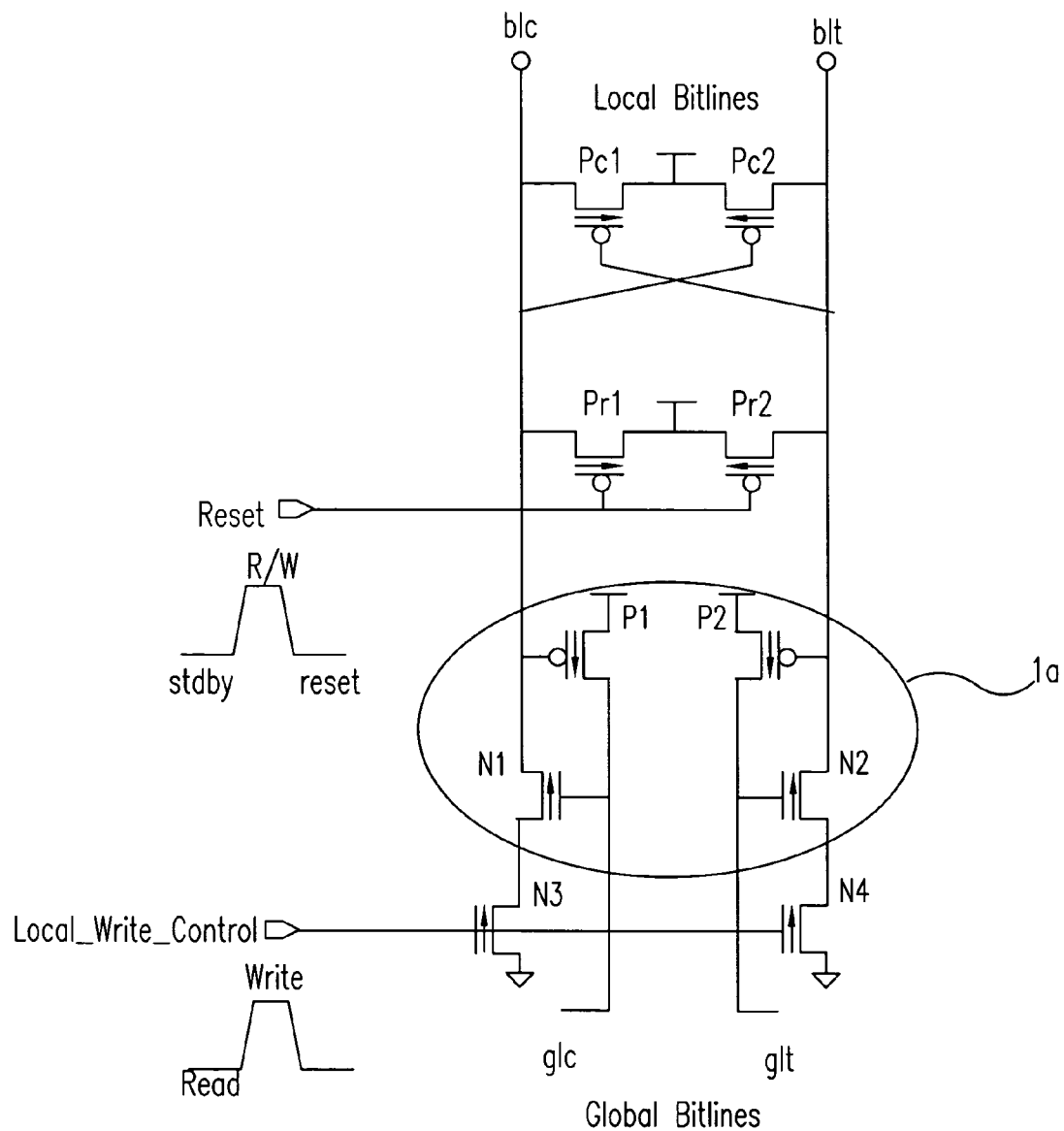
FIG. 2 is a schematic diagram of a prior art local bit select circuit.

Referring now to FIG. 2, it shows a typical prior art local bit select circuit for a domino RAM array. It consists of a pair of restore PFET transistors pr1–pr2 connecting the high power supply Vdd to bit line complement (blc) and bit line true (blt) respectively (hence the local bit lines are pre-charged to high level). The restore PFET is controlled by an active low Reset signal (i.e., low level turns on the restore PFETs). The local bit select circuit also has a pair of cross-coupled PFET transistors pc1–pc2 to hold the non-active bit line (either blc or blt) high during a read or write operation. The read operation of the local bit lines is done through PFET transistors P1–P2, outputs of which are connected to the global bit lines glt and glc. The global bit lines are pre-charged low by restore devices in a typical global bit select circuit (not shown). In a read operation, the local bit line (either blc or blt) is pulled down by the selected memory cell. The active low bit line then turns on the read PFET (P1 or P2) to pull up the global bit line. The write operation of the local bit line is control by the NFET transistor pairs N1–N3 and N2–N4. In a write operation, the local write control input is turned on (high). One side of the global bit line is pulled high while the other side stays low. The high global bit line (either glt or glc) then turns on either NFET transistor N1 or N2 to pull down on the local bit line to write into the memory cell.

Consider a specific case of a fast read before write where a six-transistor cell is fast to read and slow to write due to mismatched pass gates. Assume the cell currently holds the value '1' and a '0' is to be written. The "row" and "column" select lines activate the write function. When the RowSelect line (also know as the word line) is activated, with a '1' stored in the memory cell (not shown), the cell begins to pull down the 'blc' line in the local bit select. At the same time, the Local-Write-Control line is turned ON. For writing a '0' into the cell, the global bit line glt is activated (i.e., pull high), driving the NFETs N2 and N4 to pull down the 'bit' line. In this conventional design, both local bit lines blc and blt are falling to ground due to a fast read before write situation. The fast read and slow write situation could result in both bit lines falling to ground, and cause fighting between the cross coupled PFETs Pc1 and Pc2. Another drawback of this approach is that transistors P1 and P2 tend to amplify any dip or glitch on the local bit lines, which tends to aggravate the problem. As a result, a malfunction in write-thru (write data is passing out to the read port) will occur. Looking at this design under the situation discussed above, i.e. writing a '0' into a 6T cell holding a '1', where the cell is fast to read and slow to write, as 'blc' is pulled low, 'glc' is pulled high through P1. Since we are writing a '0', P1 is fighting to pull 'glt' high while the write data is trying to pull it low. When glt is pulled high by P1, it turns on N1, further pulling blc down to enforce a "1" in the memory cell, therefore preventing a "0" to be written. Write malfunction thus occurs.

This same situation results when the "row" select signal arrives before the "column" select signal. Assuming the same parameters as above, the cell will begin to pull down on 'blc' because it is in read mode due to the arrival of the "row" select signal. The cell will continue to pull down 'blc' until the "column" select signal arrives to activate glc, and N2/N4 are allowed to pull down the 'blt' line. If the delta between the "row" and "column" signal is too great, we see the same result as above. There is no way for this circuit to pull up the correct side to perform a correct write operation.

Figure 3:
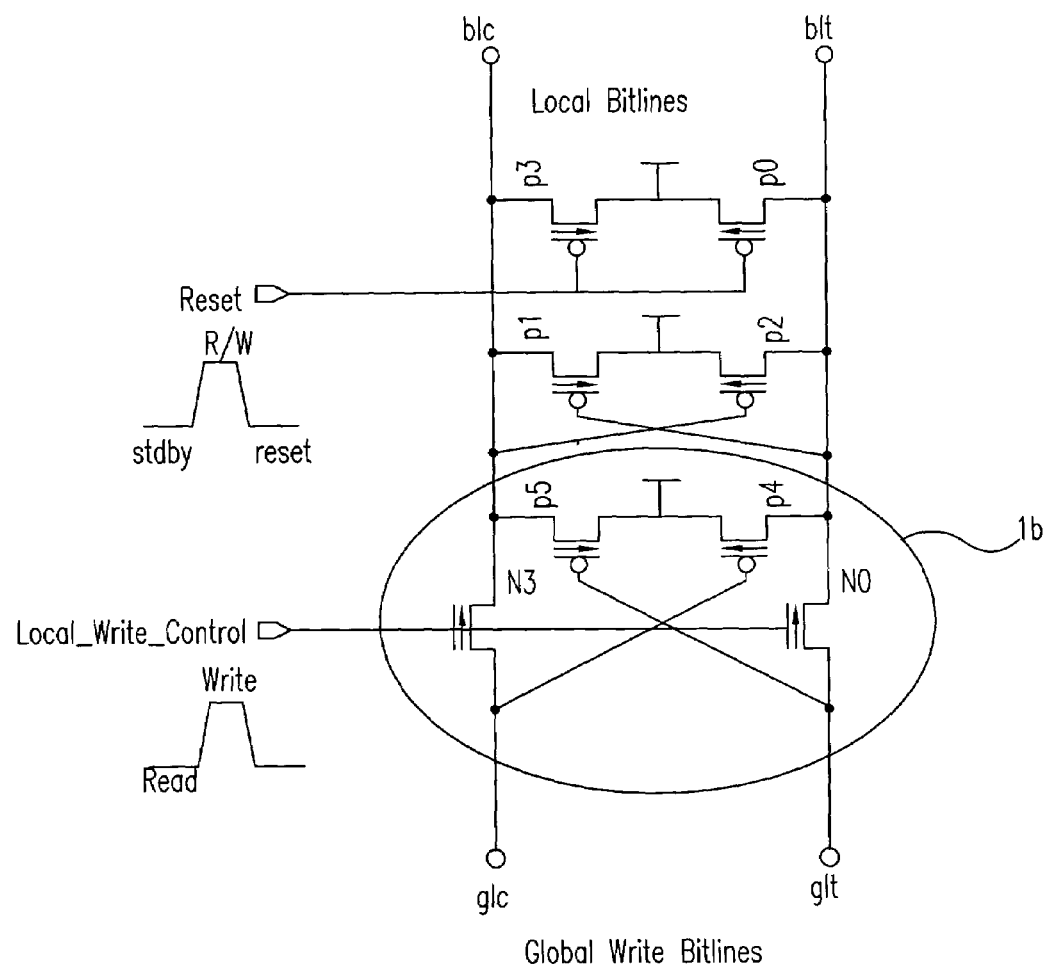
FIG. 3 is a schematic diagram of a local bit select circuit in accordance with the teachings of this invention.

FIG. 3 shows the local bit select circuit design in accordance with the teachings of this invention and which solves the fast read before write situation. The two key transistors are P4 and P5, circled with the reference number 1b. These PFETs are cross coupled with their drains attached respectively to the local bit lines blt and blc, and their gate inputs attached respectively to the global write bit lines glc and glt. PFET P4 and P5 suppress the fast read before write situation. These PFETS allow the local bit lines to be driven high (overcoming a pitfall of the conventional design as discussed above). Looking at this design under the conditions discussed above, writing a "0" to a 6T cell holding a "1" where the cell is fast to read and slow to write, the global write bit line glt is pulled low and glc is kept high, PFET P5 is turned ON and P4 is turned OFF. As the cell pulls down the 'blc' line due to fast read, P5 (driven by a low 'glt' signal) keeps the 'blc' line in a high state. P5 could overcome the cell's pulling down on the blc because its strength (i.e., device size) is chosen to be larger than that of the memory cell. With glt at low level, the "write transistor" N0 drives the 'blt' line low to perform a write "0" operation. The correct local bit line falls to ground as the other bit line is kept high, allowing a successful write to occur.

The PFETs P4 and P5 also prevent the fast read before write situation due to a mismatch in the "row" and "column" selects signals. Assume we wish to write a '0' into a cell that holds a '1', as in the above example. If the "row" select signal arrives first, the cell begins to pull down on the 'blc' line in the local bit select. This line will continue to fall until the "column" select signal arrives and the write data can be written. However, without P4 and P5, if the "row" select is active for too long before the "column" select signal arrives, the cell may pull down 'blc' to a point where it cannot be recovered (pulled high). With the addition of P4 and P5, when the "column" select signal arrives, the data on the 'glt' line allows 'blc' to be pulled high through P5, while it writes a '0' to 'blt' through N0, allowing a successful write to occur.

There are other advantages to this new design. Referring to FIG. 1, the coupling of the global write bit lines to the global read bit lines through the "OR" gates 2 tends to filter out any small glitches on the local bit lines, which is a problem with the prior design. Also, the 'glt/glc' signals are pre-charged to '1' (the high voltage state, Vdd) and driven to '0' (the low voltage state, ground) in the new design. The opposite occurs in the conventional design. This is an advantage for the new design because the pull down function is stronger than pull up due to strength advantage of an NFET vs. PFET. This allows the 'glt/glc' lines to be driven to their correct state more quickly, lessening the time of a fast read before write situation.

Figure 4:
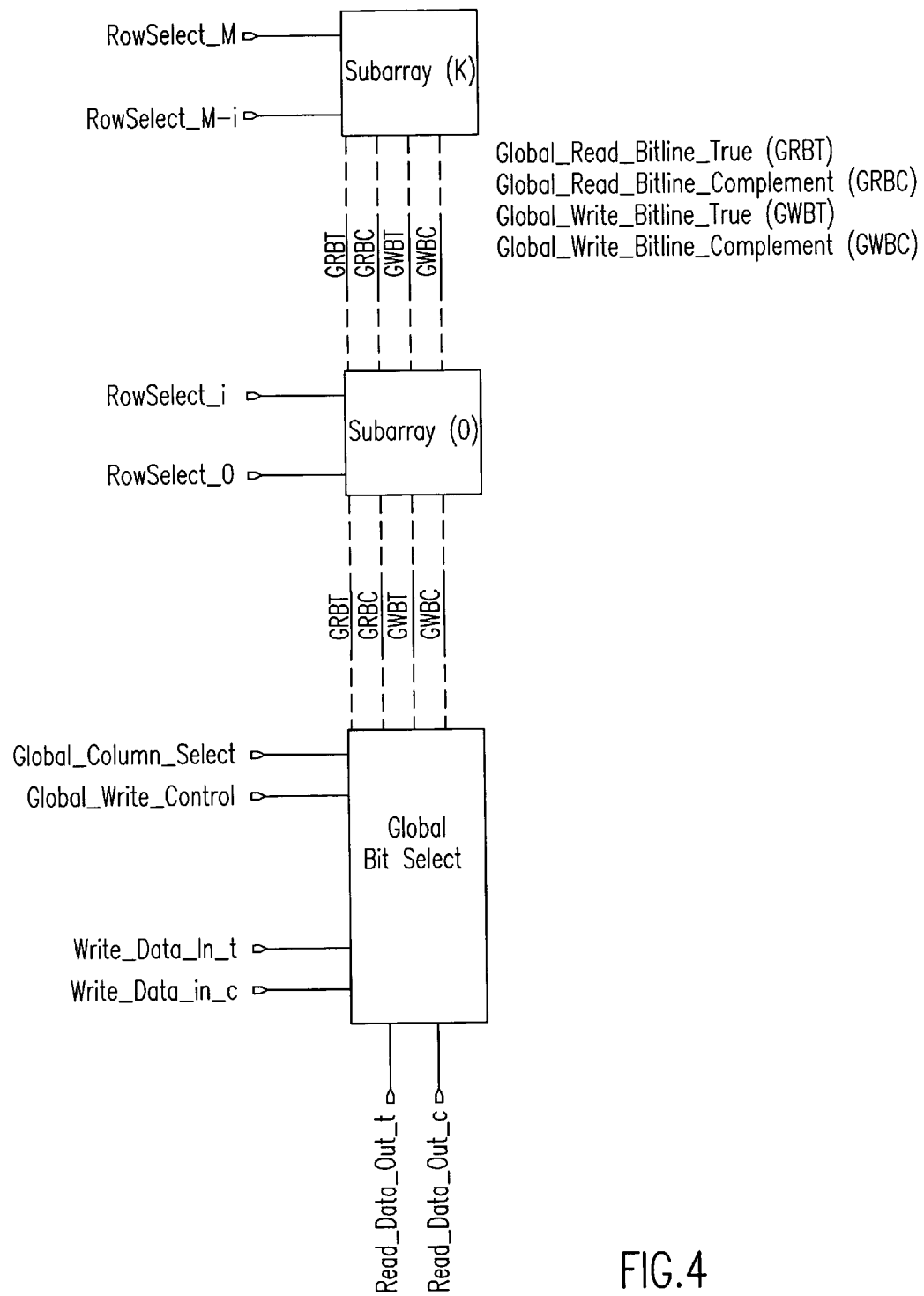
FIG. 4 is a block diagram of a one bit×M bits array in accordance with the teachings of this invention.

FIG. 4 shows a One Bit×M Bits Tall Array using the invention described above.

Figure 5:
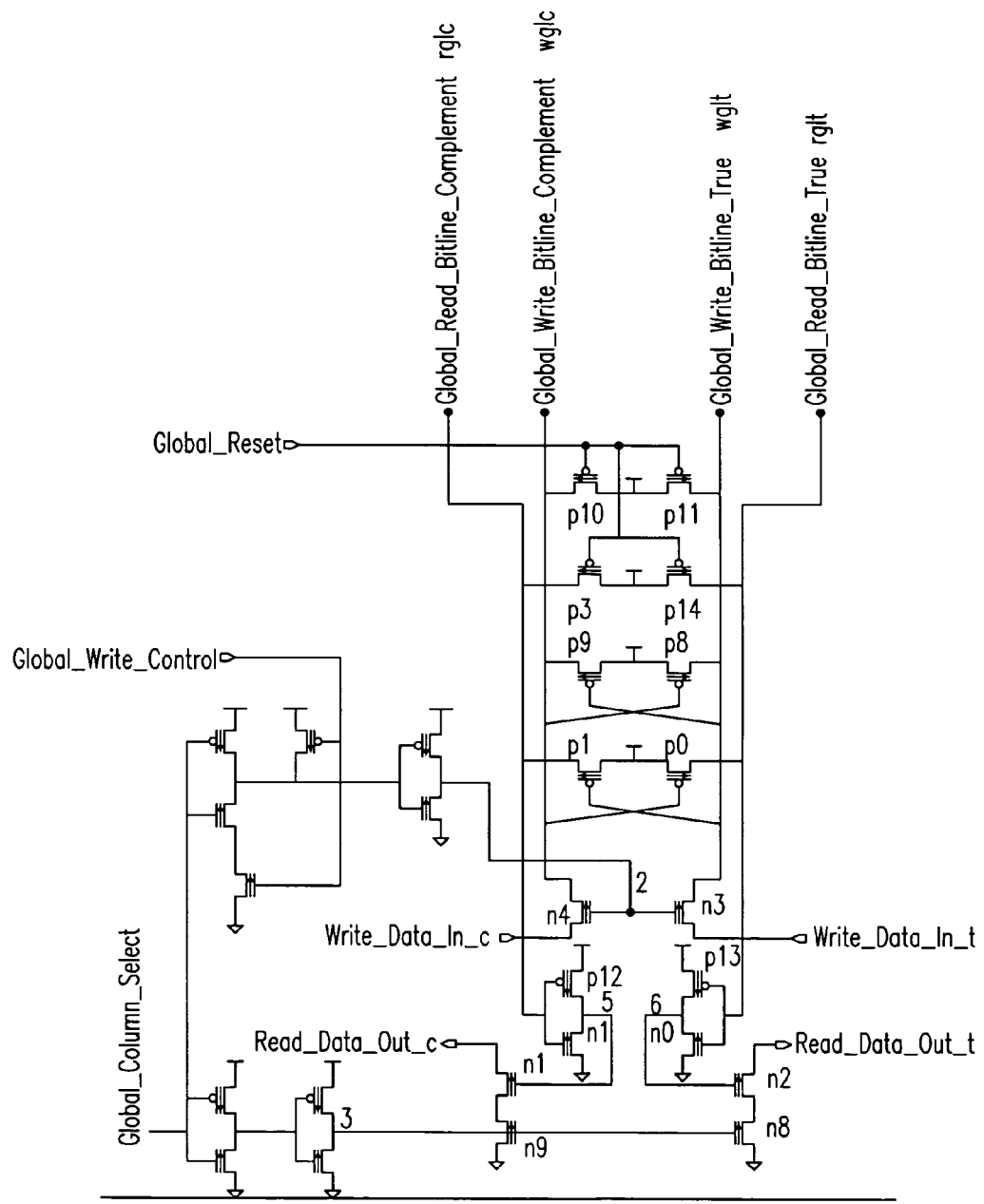
FIG. 5 is a schematic diagram of a global bit select circuit interfaced to control the local bit select in accordance with the teachings of the invention.

Referring now to FIG. 5, it shows a global bit select circuit to interface the global read bit line pair and the global write bit line pair to the local bit line pair via the Local Bit Select function shown in FIG. 1. A key component of allowing the global write bit lines to directly affect the local bit lines through P4 and P5 is to encode the column select into the global write bit lines. The global write bit lines are not allowed to fall to ground and affect the local bit lines, unless the "column select" signal has already been received. This ensures that P4 and P5 do not interrupt the local bit lines when they are performing a read operation.

Another advantage of splitting the two global bits lines of a conventional design into the 4 bit lines (2 for read/2 for write) is that there is a performance gain. The bit lines now have less loading on them, because the devices needed to control reading/writing to the bit lines are now divided onto two separate groups of bit lines, making them faster. For example, if larger write transistors are needed, the read performance is not burdened by to additional capacitance in the new circuit described here.

The global bit line circuit shown in FIG. 5 has a global read bit line pair input (rglc/rglt) and a global write bit line pair output (wglc/wglt). These two global bit line pairs are connected to the local bit select circuits along the bit column. It also has a pair of write data port (Write-Data-In-c/Write-Data-In-t) and a pair of read data output (Read-Data-Out-t/Read-Data-Out-c). Column select signals come in as the Global-Column-Select and Global-Write-Control. The Global-Column-Select, as the name suggests, selects the bit column for a read or a write operation. The Global-Write-Control enables the column for a write operation. The co-pending application entitled Global Bit Select Circuit With Dual Read and Write Bit Line Pairs, referred to above, and incorporated herein by reference, discloses the global bit select circuit in greater detail.

The invention claimed is:

1. A method for reading and writing data in a domino SRAM including the steps of:
   dividing the domino SRAM into sub-arrays of cells accessed by local bit lines, separate global write bit line pairs and global read bit line pairs, and local bit select logic;
   dividing each of said sub-arrays into two sets of cells, one set accessed by one local write bit line pair and one local read bit line pair and the other set accessed by another local write bit line pair and a local read bit line pair;
   clamping said local write bit line pairs to high voltage in response to a fast read before write cell operation; and
   coupling said one local read bit line pair and said another local read bit line pair to a global read bit line pair via a logical OR function.

2. A domino SRAM comprising in combination;
   a plurality of memory cells organized as a sub-array of memory cells in said SRAM;
   a pair of local write bit lines and a pair of local read bit lines coupled to said plurality of memory cells for reading data from said cells and for writing data to said cells;
   each said sub-array divided into two sets of cells, one set accessed by one of said pair of local write bit lines and local read bit lines and the other set accessed by another pair of said local read bit lines and local write bit lines;
   a pair of pull-up transistors coupled to said local write bit lines for connecting said local write bit lines to a pull-up voltage source; and
   said one local read bit line pair and said another local read bit line pair coupled to a global read bit line pair via a logical OR function.

* * * * *